(12) United States Patent
Hedler et al.

(10) Patent No.: US 7,022,549 B2
(45) Date of Patent: Apr. 4, 2006

(54) METHOD FOR CONNECTING AN INTEGRATED CIRCUIT TO A SUBSTRATE AND CORRESPONDING ARRANGEMENT

(75) Inventors: Harry Hedler, Deutschland (DE); Roland Irsigler, Deutschland (DE); Thorsten Meyer, Deutschland (DE)

(73) Assignee: Infineon Technologies, AG, Munich (DE)

( * ) Notice: Subject to any disclaimer, the term of this patent is extended or adjusted under 35 U.S.C. 154(b) by 65 days.

(21) Appl. No.: 10/747,670

(22) Filed: Dec. 30, 2003

(65) Prior Publication Data

US 2004/0191958 A1  Sep. 30, 2004

(30) Foreign Application Priority Data

Dec. 30, 2002   (DE) ................. 102 61 410

(51) Int. Cl.
*H01L 21/44* (2006.01)
*H01L 21/48* (2006.01)
*H01L 21/50* (2006.01)

(52) U.S. Cl. ....................... 438/108; 438/613

(58) Field of Classification Search ............ 438/25–26, 438/51, 55, 64, 98, 106–109, 121–122, 622, 438/926; 257/678, 680, 684–690, 694–697, 257/700
See application file for complete search history.

(56) References Cited

U.S. PATENT DOCUMENTS

| | | | | |
|---|---|---|---|---|
| 4,748,495 A * | 5/1988 | Kucharek | ................. | 257/713 |
| 5,400,950 A * | 3/1995 | Myers et al. | ......... | 228/180.22 |
| 5,781,415 A * | 7/1998 | Itoh | ........................ | 361/790 |
| 5,796,169 A * | 8/1998 | Dockerty et al. | .......... | 257/780 |
| 5,908,333 A * | 6/1999 | Perino et al. | .............. | 439/631 |
| 5,947,753 A * | 9/1999 | Chapman et al. | ............ | 439/79 |
| 5,981,310 A * | 11/1999 | DiGiacomo et al. | ........ | 438/106 |
| 6,012,224 A * | 1/2000 | DiStefano et al. | ............ | 29/840 |
| 6,130,116 A * | 10/2000 | Smith et al. | ................ | 438/127 |
| 6,238,938 B1 * | 5/2001 | Smith | ........................ | 438/10 |
| 6,562,637 B1 * | 5/2003 | Akram et al. | ................ | 438/14 |
| 6,717,819 B1 * | 4/2004 | Chung | ....................... | 361/760 |
| 6,848,173 B1 * | 2/2005 | Fjelstad et al. | .............. | 29/840 |
| 2002/0090761 A1 * | 7/2002 | Goldmann et al. | ......... | 438/124 |
| 2002/0140081 A1 * | 10/2002 | Chou et al. | ................. | 257/700 |
| 2003/0030143 A1 * | 2/2003 | Wennemuth et al. | ....... | 257/738 |
| 2003/0096518 A1 * | 5/2003 | Tsai | ........................... | 439/81 |
| 2005/0070049 A1 * | 3/2005 | Cheng et al. | ............... | 438/117 |

FOREIGN PATENT DOCUMENTS

| | | |
|---|---|---|
| DE | 101 26 296 A1 | 12/2002 |
| JP | 10112478 A | 4/1998 |
| WO | WO 00/79589 A1 | 12/2000 |

\* cited by examiner

*Primary Examiner*—David A. Zarneke
(74) *Attorney, Agent, or Firm*—Morrison & Foerster LLP

(57) ABSTRACT

An integrated circuit, in particular from a chip, a wafer or a hybrid, to a substrate. A package is provided for the integrated circuit, which has a connection side, on which there are provided a plurality of connection regions for connection to the substrate. A corresponding plurality of connection regions are provided on the substrate, and elevated contact regions are provided on the connection regions of the package and/or the connection regions of the substrate. The elevated contact regions include a first group of contact regions and a second group of contact regions. A connection of the package to the substrate is created via the elevated contact regions. The elevated contact regions configured such that the first group of contact regions form a rigid connection and the second group of contact regions form an elastic connection between the package and the substrate. The invention likewise provides a corresponding circuit arrangement.

20 Claims, 3 Drawing Sheets

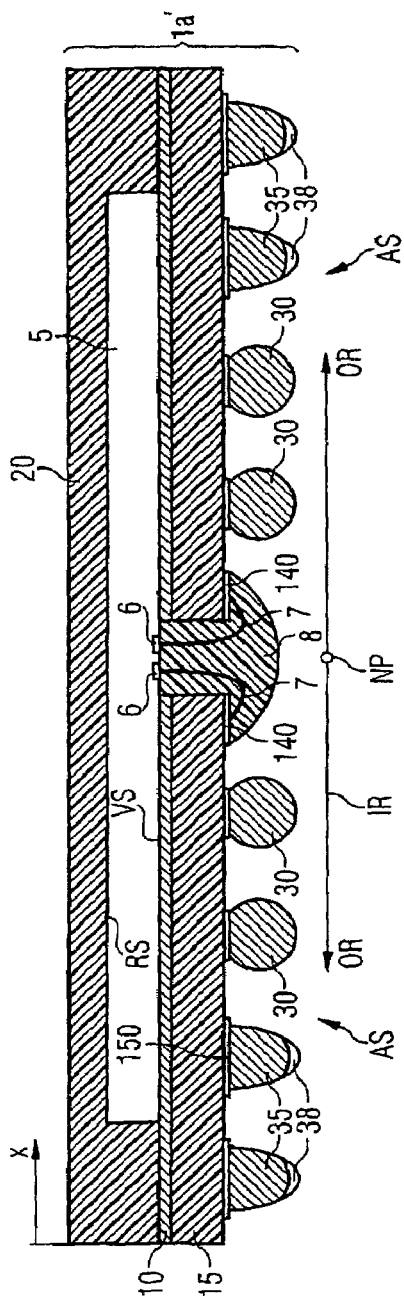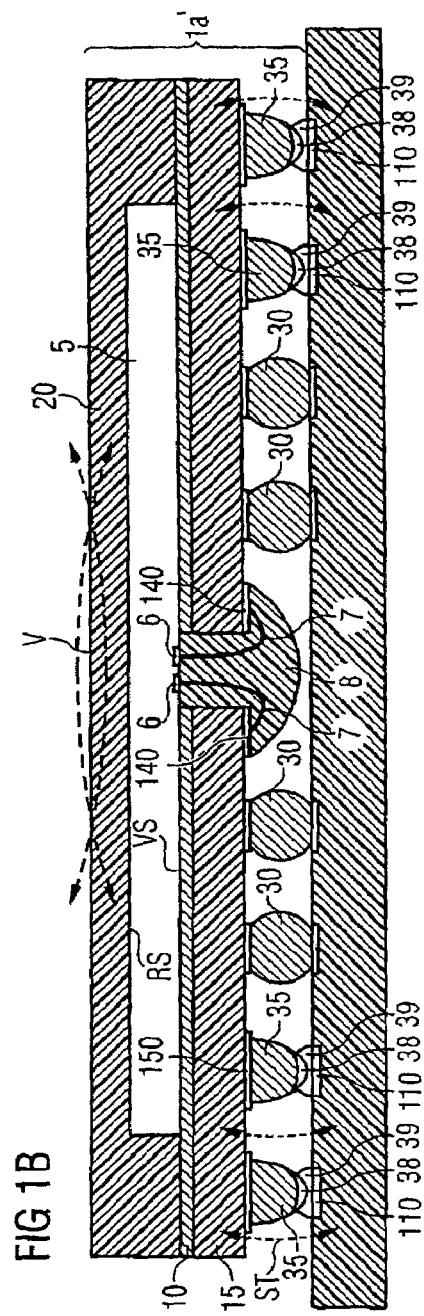

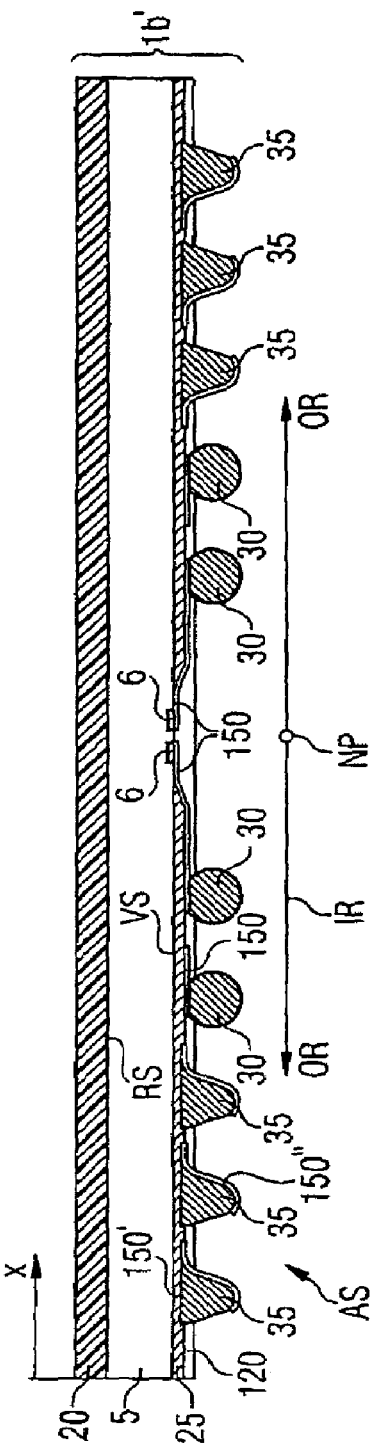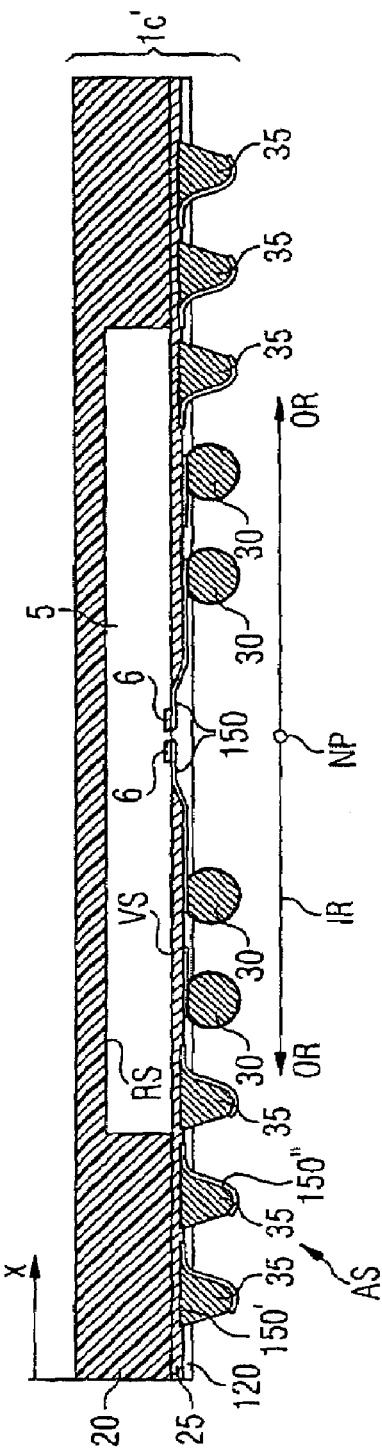

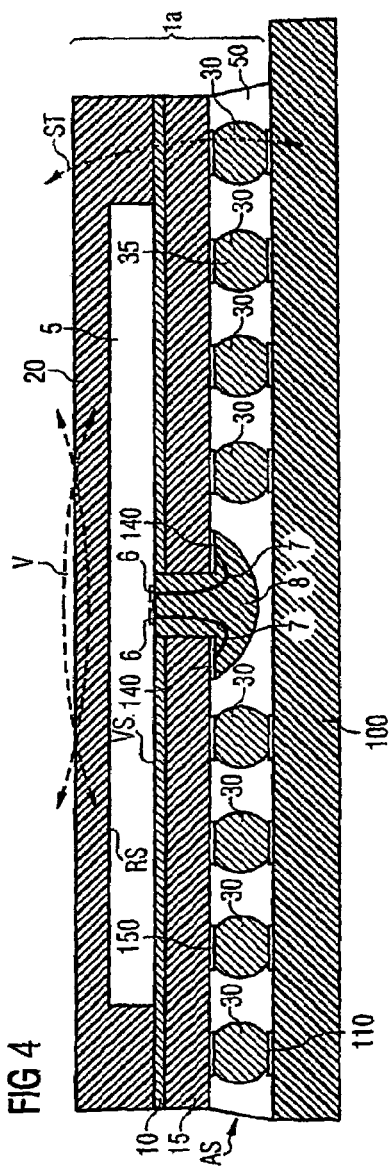
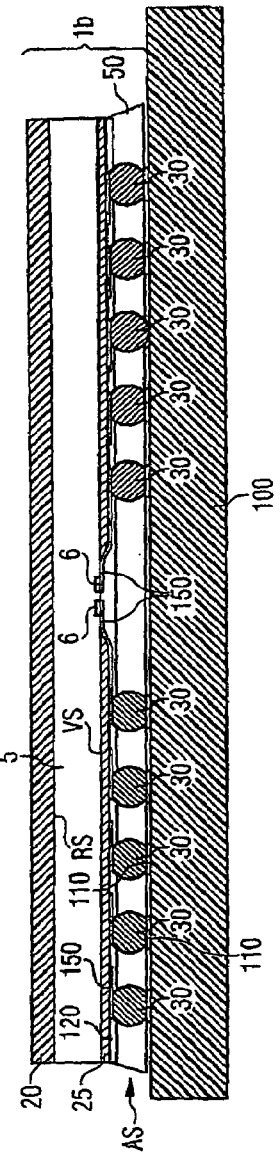

METHOD FOR CONNECTING AN INTEGRATED CIRCUIT TO A SUBSTRATE AND CORRESPONDING ARRANGEMENT

CLAIM FOR PRIORITY

This application claims the benefit of priority to German Application No. 102 61 410.5, filed in the German language on Dec. 30, 2002, the contents of which are hereby incorporated by reference.

TECHNICAL FIELD OF THE INVENTION

The present invention relates to a method for connecting an integrated circuit to a substrate and a corresponding circuit arrangement.

BACKGROUND OF THE INVENTION

Although applicable in principle to any desired integrated circuits, the present invention and also the problem area on which it is based are explained with regard to chips with integrated circuits in silicon technology.

Known CSP (Chip Size Package) or WLP (Wafer Level Package) solutions for connecting an integrated circuit to a substrate have reliability problems in the event of temperature changes particularly in the case of large circuit arrangements, to be precise particularly in the context of ever decreasing distances between substrate and packaged chip. The different thermal expansion coefficients of packaged circuit arrangement and substrate give rise to different linear expansions of the two components during the temperature changes.

In the case of chip size packages and wafer level packages, essentially two types of connecting structures between the chip and the substrate have been disclosed heretofore.

The first customary solution for connecting an integrated circuit to a substrate is the use of ball grid arrays with rigid solder balls or bumps for mechanical connection with the additional use of an underfill in order to increase the stability. In the case of this solution, the mismatch of the thermal properties of the chip and of the substrate, in particular of the thermal expansion coefficient, leads to major reliability risks. The solder balls may be sheared away in the event of temperature changes. This considerably restricts the reliability, particularly in the case of large chips.

In order to prevent such undesirable defects, various types of interposer layers have been developed, which serve as stress buffers between the chip having a low thermal expansion coefficient and the substrate having a highs thermal expansion coefficient. Such solutions increase the height of the construction, the number of connections and at least the costs.

FIG. 4 shows a diagrammatic view of a part of an interposer-type circuit arrangement for elucidating the problem area on which the invention is based.

In FIG. 4, reference symbol 100 designates a circuit substrate, for example in the form of a module board. Reference symbol 1a designates in combinative fashion a package of an integrated circuit, which is a chip 5 in the present case. The chip 5 has contact pads 6, at which electrical connections of the circuit situated therein are routed toward the outside. An interposer 15 is applied on the front side VS of the chip 5 by means of an adhesive layer 10, which interposer has, in the center, a feedthrough through which leads 7 are routed in a manner sealed by an adhesive 8, which are connected to the contact pads 6 at one of their ends and to connection regions 140 at their other end, the latter being provided on the connection side AS of the package 1a. The connection regions 140 are connected to a rewiring having a plurality of connection regions 50 which are provided for connection to a corresponding number of connection regions 110 on the circuit substrate 100.

This mechanical and electrical connection is realized by corresponding solder balls 30 between the connection regions 110, 150, an underfill agent 50 in the form of an adhesive additionally being introduced between circuit substrate 100 and interposer 15.

An encapsulation 20, for example made of nontransparent epoxy resin, is provided on the rear side of the chip 5. The broken lines in FIG. 4 designate a flexure influence V on account of thermal mismatches, which has the effect that, in the case of a geometry of this type, the edge regions, in particular, are subject to a high stress ST. This stress ST is ultimately the reason why the outer solder balls are often sheared away or torn away in the event of temperature changes.

FIG. 5 shows a diagrammatic view of a part of a chip-size-type circuit arrangement for elucidating the problem area on which the invention is based.

In contrast to the arrangement in accordance with FIG. 4, no interposer is provided in the case of the arrangement in accordance with FIG. 5. Rather, a dielectric layer 25 is situated there on the front side VS of the chip 5, on which dielectric layer there are provided connection regions 150 connected to the contact pads 6 via the rewiring. Analogously to the example according to FIG. 4, solder balls 30 are provided, which provide a mechanical and electrical connection between the package 1b with the chip 5 and the circuit substrate 100. In order to provide an undesirable flowing away of solder, a solder resist layer of 120 is furthermore provided on the connection side AS, which layer has the effect that the solder balls 30 are maintained at the locations provided and do not flow away. In this example, too, an underfill layer 50 in the form of an adhesive layer is provided for stabilization.

A further solution for connecting an integrated circuit to a substrate is the use of elastic elevations, which is disclosed in WO 00/79589 A1. The latter discloses an electronic component having flexible raised portions made of an insulating material on a surface, an electrical contact being arranged on the flexible elevation and a conduction path being arranged on the surface or in the interior of the flexible elevation between the electrical contact and the electronic circuit. The advantage of this solution is a smaller construction height, a higher reliability and lower costs. In this connection, it is known to solder or adhesively bond the elastic contact elements onto the substrate.

One disadvantage of this solution is that the dissipation of heat from the integrated circuit is significantly poorer in the case of flexible plastic contact elements than in the case of solder balls. A further disadvantage resides in poorer mechanical fixing.

SUMMARY OF THE INVENTION

The present invention provides a simple and cost-effective method for connecting an integrated circuit to a substrate and a corresponding circuit arrangement which remains largely uninfluenced by thermal mismatch but nevertheless has good heat dissipation properties.

In one embodiment of the invention, the elevated contact regions are configured such that the first group of contact regions form a rigid connection and the second group of contact regions form an elastic connection between the package and the substrate. By virtue of suitable arrangement, it is thus possible, on the one hand, to elastically compensate for the thermal mismatch, but on the other hand to maintain a good dissipation of heat and fixed mechanical linking. In this connection, it should be mentioned that the contact regions need not necessarily have an electrical contact function, but rather may at least partly have only a thermal/mechanical function.

It was found in the conception of the present invention that the effect of different linear expansions is greater, the greater the distance from a neutral point of the circuit arrangement. Starting from a specific distance from such a neutral point, the stress that arises during temperature changes can no longer be cushioned by the package, and the weakest components—generally the solder balls—are destroyed, since the solder connection is not very elastic and tears away above a specific shear force.

The specific location of a neutral point depends on the geometrical construction of the packaged integrated circuit and the substrate.

In accordance with one preferred embodiment, the first group of contact regions is arranged in a near region surrounding a point of the connection side, and the second group of contact regions is arranged outside in a far region surrounding the near region.

In accordance with a further preferred embodiment, the point lies approximately in the center of an extent in a predetermined direction of the package.

In accordance with a further preferred embodiment, the contact regions of the first group comprise solder elements and the contact regions of the second group comprise plastic elements.

In accordance with a further preferred embodiment, the plastic elements comprise electrically conductive polymer and/or adhesive and/or silicone.

In accordance with a further preferred embodiment, the plastic elements are provided with a solderable metal coating at their side to be connected.

In accordance with a further preferred embodiment, the plastic elements comprise electrically nonconductive polymer and/or adhesive and/or silicone and are provided with a metallic interconnect at their side to be connected, said interconnect being electrically connected to the integrated circuit.

In accordance with a further preferred embodiment, the package has an interposer on the front side of the integrated circuit, the connection regions of the package being provided on that side of said interposer which is remote from the integrated circuit.

In accordance with a further preferred embodiment, the package has an insulating layer on the front side of the integrated circuit, the connection regions of the package being provided on that side of the insulating layer which is remote from the integrated circuit.

In accordance with a further preferred embodiment, the package is provided at least on the rear side of the integrated circuit as an encapsulation.

BRIEF DESCRIPTION OF THE DRAWINGS

Exemplary embodiments of the invention are illustrated in the drawings and explained in more detail in the description below.

In the figures:

FIGS. 1a,b show a diagrammatic view of a part of a circuit arrangement in accordance with a first embodiment of the present invention.

FIG. 2 shows a diagrammatic view of a part of a circuit arrangement in accordance with a second embodiment of the present invention.

FIG. 3 shows a diagrammatic view of a part of a circuit arrangement in accordance with a third embodiment of the present invention.

FIG. 4 shows a diagrammatic view of a part of an interposer-type circuit arrangement for elucidating the problem area on which the invention is based.

FIG. 5 shows a diagrammatic view of a part of a chip-size-type circuit arrangement for elucidating the problem area on which the invention is based.

DETAILED DESCRIPTION OF THE INVENTION

In the figures, identical reference symbols designate identical or functionally identical constituent parts.

FIGS. 1a, b show a diagrammatic view of a part of a circuit arrangement in accordance with a first embodiment of the present invention.

In FIG. 1a, reference symbol 1a' designates a modified package which differs from the example in FIG. 4 by the fact that, on the connection side AS, solder balls 30 are provided only on connection areas 150 located within a specific near region IR with regard to a neutral point NP.

The neutral point NP is, for the x direction, the point at which the thermal mismatch of the different components has the least influence. In other words, no stresses or only very small stresses occur here. These stresses increase with increasing distance from the neutral point NP. Within the near region IR, said stresses are restricted to a magnitude which does not lead to destructive alterations in the case of the desired temperature change range. Accordingly, contact regions for connection to the circuit substrate 100 are solder balls 30 there.

By contrast, the stresses in the far region OR are so large that they cannot be endured by solder balls 30. Correspondingly, in this embodiment, elastic conductive plastic elements 35 are provided there at the corresponding connection areas 150, which plastic elements have a metalization region 38 of a solderable metal at their connecting side, i.e. the side for connection to the circuit substrate 100.

With reference to FIG. 1b, the connection to the circuit substrate 100 is effected in the region of the solder balls 30 in a customary manner and in the region of the plastic elements 35 with the aid of additional solder 39, which, in this example, is applied to the corresponding connection areas 110 of the circuit substrate.

The resulting connection between the package 1a' with the chip 5 and the circuit substrate 100 is significantly less susceptible to the stresses ST which arise on account of the thermal mismatches. This is because the elastic plastic elements 35 can be compressed, dilated and distorted to a significantly greater extent.

Although the contact regions 30, 35 have an electrical function in this exemplary embodiment, this is not absolutely necessary; it is possible, by way of example, to provide additional contact regions 30, 35 having only a mechanical or thermal/mechanical function.

FIG. 2 shows a diagrammatic view of a part of a circuit arrangement in accordance with a second embodiment of the present invention.

The embodiment in accordance with FIG. 2 corresponds to the known circuit arrangement explained above with reference to FIG. 5. Here, too, the contact elements have been retained in the form of solder balls 30 in the near region IR of the neutral point NP. By contrast, elastic plastic elements made of a nonconductive material have been provided in the connection regions 150' located in the far region OR. The connection regions 150' are not conductive here, but rather serve only for mechanical connection.

In order to produce a conductive connection to the rewiring which is connected to the contact pads 6 of the chip 5, interconnects 150', have been routed to the surface of the elastic plastic elements 35. Consequently, as in the first embodiment mentioned above, the package 1b' with the chip 5 can be adhesively bonded or soldered onto the circuit substrate 100, and it is possible to achieve the same advantages as in the first embodiment.

FIG. 3 shows a diagrammatic view of a part of a circuit arrangement in accordance with a third embodiment of the present invention.

The embodiment in accordance with FIG. 3 differs from the embodiment in accordance with FIG. 2 insofar as the region of the rewiring is lengthened over the side edges of the chip, which is usually also referred to as fan-out.

Although the present invention has been described above on the basis of preferred exemplary embodiments, it is not restricted thereto, but rather can be modified in diverse ways.

In particular, the present invention can be employed not only for chips but also for hybrids, wafers or other integrated circuits. Moreover, the invention is not restricted to the materials specified.

LIST OF REFERENCE SYMBOLS

100 Circuit substrate
20 Encapsulation
110,150
140,150' Connection regions
7 Lines
8 Adhesive composition
AS Connection side
VS Front side
RS Rear side
5 Chip
10 Adhesive layer
15 Interposer
30 Solder balls
35 Plastic elements
6 Contact pads
38 Metalization
IR Near region
OR Far region
1a,1b,
1a',1b',
1c' Package including chip
NP Neutral point
ST Stress
V Flexure effect
39 Solder
150" Interconnect
25 Dielectric
120 s Solder resist layer

What is claimed is:

1. A method for connecting an integrated circuit to a substrate, comprising:
    providing a package for the integrated circuit, which has a connection side, on which there are provided a plurality of connection regions for connection to the substrate;
    providing a corresponding plurality of connection regions on the substrate;
    providing elevated contact regions on the connection regions of the package and/or the connection regions of the substrate, the elevated contact regions comprising a first group of contact regions and a second group of contact regions; and
    creating a connection of the package to the substrate via the elevated contact regions, the elevated contact regions configured such that the first group of contact regions form a rigid connection and the second group of contact regions form an elastic connection between the package and the substrate, wherein the first and second groups of contact regions are included within a single layer and the first and second groups are disposed between the package and the substrate.

2. The method according to claim 1, wherein the first group of contact regions is arranged in a near region surrounding a point of the connection side, and the second group of contact regions is arranged outside in a far region surrounding the near region.

3. The method according to claim 2, wherein the point lies approximately in a center of an extent in a predetermined direction of the package.

4. The method according to claim 1, wherein the contact regions of the first group comprise solder elements and the contact regions of the second group comprise plastic elements.

5. The method according to claim 4, wherein the plastic elements comprise electrically conductive polymer and/or adhesive and/or silicone.

6. The method according to claim 5, wherein the plastic elements are provided with a solderable metal coating at their side to be connected.

7. The method according to claim 4, wherein the plastic elements comprise electrically nonconductive polymer and/or adhesive and/or silicone and are provided with a metallic interconnect at their side to be connected, the interconnect being electrically connected to the integrated circuit.

8. The method according to claim 1, wherein the package has an interposer on the front side of the integrated circuit, the connection regions of the package are provided on a side of the interposer which is remote from the integrated circuit.

9. The method according to claim 1, wherein the package has an insulating layer on the front side of the integrated circuit, the connection regions of the package are provided on a side of the insulating layer which is remote from the integrated circuit.

10. The method according to claim 1, wherein the package is provided at least on the rear side of the integrated circuit as an encapsulation.

11. A circuit arrangement having a connection of an integrated circuit to a substrate, comprising:
    a package of the integrated circuit, which has a connection side, on which there are provided a plurality of connection regions for connection to the substrate;
    a corresponding plurality of connection regions on the substrate; and
    elevated contact regions, which connect the connection regions of the package to the connection regions of the substrate, the elevated contact regions comprising a first group of contact regions and a second group of contact regions, which are configured such that the first group of contact regions form a rigid connection and the second group of contact regions form an elastic connection between the package and the substrate, wherein the first and second groups of contact regions are included within a single layer and the first and second groups are disposed between the package and the substrate.

12. The method according to claim 11, wherein the first group of contact regions is arranged in a near region surrounding a point of the connection side, and the second group of contact regions is arranged outside in a far region surrounding the near region.

13. The method according to claim 12, wherein the point lies approximately in a center of an extent in a predetermined direction of the package.

14. The method according to claim 11, wherein the contact regions of the first group comprise solder elements and the contact regions of the second group comprise plastic elements.

15. The method according to claim 14, wherein the plastic elements comprise electrically conductive polymer and/or adhesive and/or silicone.

16. The method according to claim 15, wherein the plastic elements are provided with a solderable metal coating at their side to be connected.

17. The method according to claim 14, wherein the plastic elements comprise electrically nonconductive polymer and/or adhesive and/or silicone and are provided with a metallic interconnect at their side to be connected, the interconnect being electrically connected to the integrated circuit.

18. The method according to claim 11, wherein the package has an interposer on the front side of the integrated circuit, the connection regions of the package being provided on a side of the interposer which is remote from the integrated circuit.

19. The method according to claim 11, wherein the package has an insulating layer on the front side of the integrated circuit, the connection regions of the package provided on a side of the insulating layer which is remote from the integrated circuit.

20. The method according to claim 11, wherein the package is provided at least on the rear side of the integrated circuit as an encapsulation.

* * * * *